United States Patent [19]
Varon et al.

[11] Patent Number: 4,757,357
[45] Date of Patent: Jul. 12, 1988

[54] LIGHT-EMITTING DIODE MATRIX WITH SEMI-INSULATING ZONES

[75] Inventors: Jacques J. Varon, Troan; Marc Mahieu, Caen, both of France

[73] Assignee: U.S. Philips Corporation, New York, N.Y.

[21] Appl. No.: 798,659

[22] Filed: Nov. 15, 1985

[30] Foreign Application Priority Data

Nov. 23, 1984 [FR] France .................. 84 17894

[51] Int. Cl.⁴ .................................. H01L 33/00
[52] U.S. Cl. ........................... 357/17; 357/45; 357/16; 357/55; 357/20
[58] Field of Search ............. 357/17, 45, 16, 55, 357/20

[56] References Cited

U.S. PATENT DOCUMENTS 3,996,492 12/1976 McGroddy .................. 357/17 X
4,198,251 4/1980 Gaffre ........................ 357/17 X
4,275,403 6/1981 Lebailly ........................ 357/17
4,309,670 1/1982 Burnham et al. ............. 357/17 X Primary Examiner—Andrew J. James
Assistant Examiner—William A. Mintel
Attorney, Agent, or Firm—Jack Oisher; Steven R. Biren

[57] ABSTRACT

The invention relates to a matrix of light-emitting diodes and a method of manufacturing same. A matrix comprises highly doped contact lines of a first conductivity type, localization zones of the second conductivity type opposite to the first type extending transversely with respect to the semi-insulating zones arranged along lines and/or columns and separating along diodes an active layer in contact with the contact lines and a superficial injection layer. The contacts connect the diodes columnwise, regions being internally limited along lines by the area straight above the upper parts of the localization zones, and along columns by the semi-insulating regions. Thus, the contacts are entirely situated outside the light emitting zones defined by the localization zones. The method of manufacturing utilizes steps of localized etching and epitaxy.

6 Claims, 2 Drawing Sheets

LIGHT-EMITTING DIODE MATRIX WITH SEMI-INSULATING ZONES

BACKGROUND OF THE INVENTION

The invention relates to a matrix of light-emitting diodes having at least one active layer of a III-V semiconductor material of a first conductivity type and a superficial injection layer of a III-V semiconductor material of the second opposite conductivity type and semi-insulating zones arranged at least in columns and extending over the thickness of the injection layer and of the active layer in such a manner that in the layers they separate individual diodes from each other at least in part and that they comprise at least a part of the conducting contacts.

Such a matrix is known from French Patent Application published under No. 2,491,714, corresponding to published British Patent Application 2,085,227.

This application discloses a matrix of diodes for which the contacts connecting one electrode of the diodes linewise and the other electrode columnwise are disposed on a surface and have contact fingers situated above the active emission regions. This arrangement is suitable only for diodes intrinsically of large dimensions, for which the loss of light due to the contact fingers is not excessively high.

SUMMARY OF THE INVENTION

According to the invention, the contacts are disposed on two opposite surfaces of the matrix and the latter has a buried localization layer which permits limiting the emission zone of each diode. The contacts can then be disposed outside the emission zone, without loss of efficiency, and on a substantial part and, as the case may be, along the whole periphery of each diode. The matrix according to the invention is for this purpose characterized in that each semi-insulating zone extends from the surface of the injection layer to a localization zone of a III-V semiconductor material of a binary composition and of the second conductivity type, the localization zones each having in cross-section an upper part and a lower part, the upper parts defining a bidimensional lattice of cells filled by elongated parts of the active layer, and said lower parts being spaced apart by semiconducting electrical contact regions at a high doping level of the first conductivity type arranged parallel to lines in such a manner that they interconnect the diodes linewise at the level of said prolonged parts, and in that it comprises on the injection layer electrical contact metallizations having for each diode contact regions extending internally substantially above the upper parts of the localization zones and intereconnected columnwise, the interconnection columns thus constituted being electrically insulated from each other by said semi-insulating zones arranged in columns.

The active layer and the injection layer can be of a III-V semiconductor material of a binary or a ternary composition.

The invention can be used more particularly in the case in which the binary composition is gallium arsenide (GaAs) and the ternary composition is gallium-aluminum arsenide (GaAlAs).

According to a preferred embodiment, the semi-insulating zones extend also in lines in such a manner that an optimum electrical insulation is obtained between the adjacent diodes.

The invention further relates to a method of manufacturing the aforementioned matrix.

In this method, according to the aforementioned prior art, an injection layer and an active layer of a III-V semiconductor material are formed by hetero-epitaxy on a substrate and the individual diodes are separated from each other at least in part by bombarding regions defined in order to form at least columns of semi-insulating zones over the thickness of the injection layer and of the active layer.

The method according to the prior art provides a structure whose disadvantages have been mentioned above. The method according to the invention utilizes steps of etching certain epitaxially deposited layers to permit burying contact lines and localization zones, the latter limiting the light emission to regions for which the emitted light is not absorbed by deposited electrical contacts, i.e. of optimum efficiency.

For this purpose, the method comprises the following steps:

depositing epitaxially on the substrate a first III-V semiconductor layer of a binary composition which is highly doped and is of a first conductivity type;

etching in the first layer a first group of openings arranged parallel to the lines according to a given pitch, the subsisting parts of the first regions layer forming semiconductor electrical contact regions interconnecting the diodes linewise;

epitaxially depositing a second III-V semiconductor layer of a binary composition and of the second conductivity type;

in order to form a localization layer, etching in the second III-V semiconductor layer a second group of openings forming a bidimensional lattice offset along the line by a half pitch with respect to those of the first group, the openings of the second layer being provided in an upper part of the localization layer which covers in part the semiconducting electrical contact regions;

epitaxially depositing successively the active layer of the first conductivity type and the injection layer of the second conductibity type;

carrying out the bombardment;

forming electrical contact metallizations on the injection layer, which comprise for each diode on the one hand contact regions extending internally parallel to the lines substantially above the upper parts of the localization layer and interconnected columnwise, the interconnection connections columns thus consituted being electrically insulated from each other by the semi-insulating zones arranged in columns.

The bombardment step can be such that it also forms lines of semi-insulating regions in such a manner that an optimum electrical insulation is obtained between the adjacent diodes.

The layer of a binary composition is advantageously made of gallium arsenide. The active layer and the injection layer can be of a binary composition, for example of gallium arsenide, or of a ternary composition, for example, of gallium-aluminum arsenide.

BRIEF DESCRIPTION OF THE DRAWING

The invention will now be described more fully, by way of example, with reference to the accompanying drawings, in which.

DESCRIPTION OF THE PREFERRED EMBODIMENTS

Figure 1A:
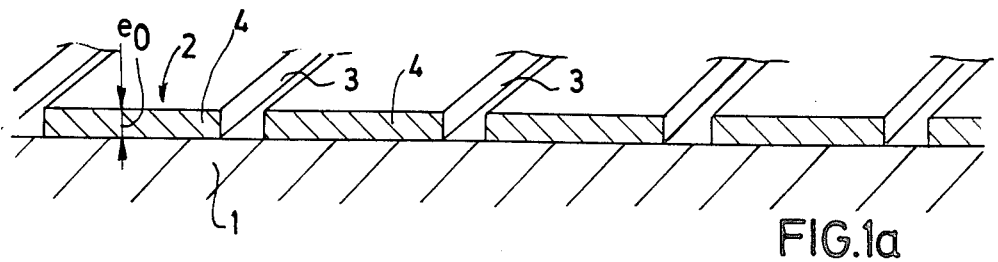
FIGS. 1a to 1e show in vertical sectional view and FIGS. 1a and 1c show in perspective view the different steps of the manufacturing method.

According to FIG. 1a, a substrate 1 of GaAs, which is semi-insulating or of the n-type, is coated by epitaxy from the liquid phase with a layer 2 of GaAs of the p+type (doping of the order of $10^{19}$ cm$^{-3}$) having a thickness $e_0$ of the order of 4 to 6 μm. On this layer is deposited a mask, in which openings have been formed arranged along a substantially equidistant lines at a given pitch so that by etching with a solution whose composition in volume is of the order of 96 $H_2SO_4$-$2H_2O_2$-$2H_2O$, openings 3 can be obtained. The subsisting parts 4 of the layer 2 constitute conducting regions disposed along lines.

Figure 1B:
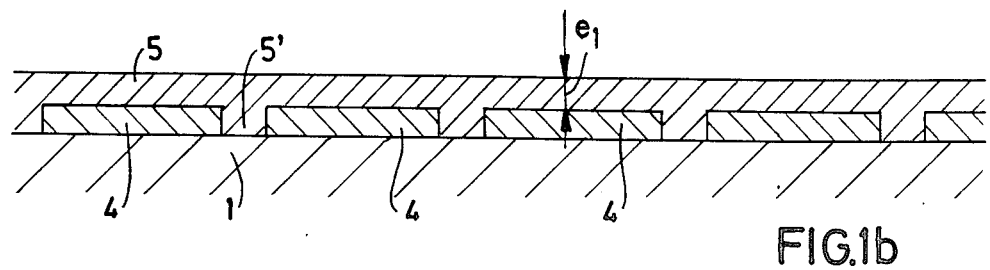

According to FIG. 1b, a layer 5 of GaAs of the n-type (doping of the order of $10^{17}$ per cm$^3$) having an excess thickness $e_1$ of about 2 to 4 μm is then deposited by epitaxy.

Figure 1C:
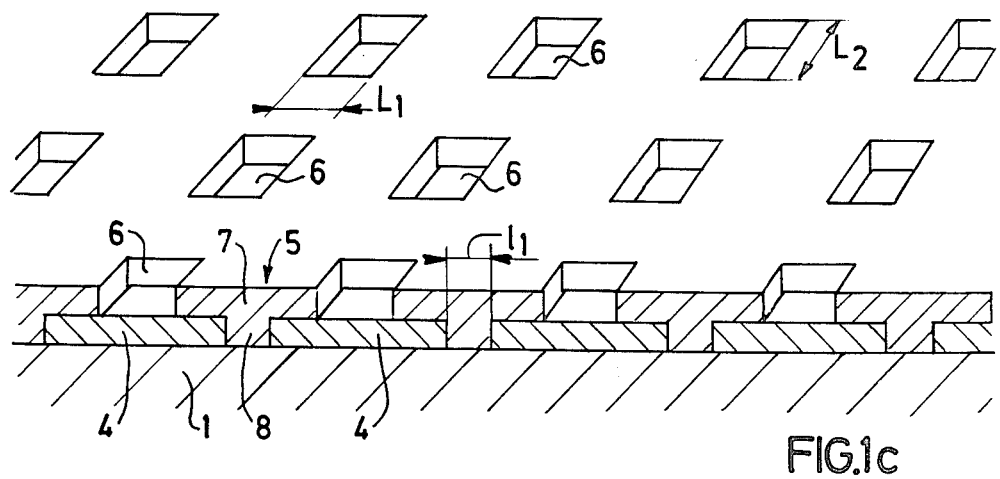

According to FIG. 1c, this layer 5 is coated with a masking layer in which openings have been provided, which form a bidimensional lattice, which has along the lines the same pitch as in FIG. 1a, but now laterally offset by half a pitch. By means of a solution of $H_2SO_4$-$H_2O_2$-$H_2O$ of the kind mentioned above, openings 6 are etched. A bidimensional lattice of localization zones, located at a relative distance and comprising in lines and columns each an upper part 7 and a lower part 8, of the layer 5.

Figure 1D:
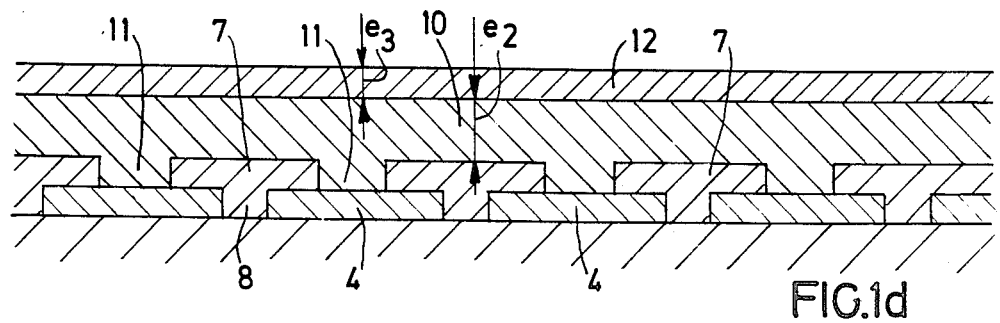

According to FIG. 1d, an active layer 10 of $Ga_{0.65}Al_{0.35}As$ of the p-type having an excess thickness $e_2$ of about 4 to 8 μm (doping of 1 to $4\times10^{18}$ cm$^{-3}$) is formed by epitaxy, whereupon an injection layer 12 of $Ga_{0.3}Al_{0.7}As$ of the n-type is deposited having a thickness $e_3$ equal to about 4 to 5 μm, which is suitable for an emission in the red (about 650 nm).

Figure 1E:
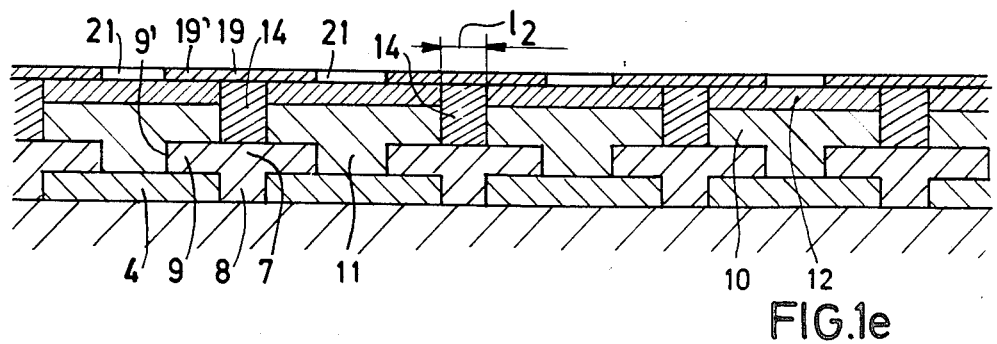

According to FIG. 1e, a proton bombardment is effected through a mask of polyimide or of metal, for example of gold, so that zones 14 arranged in lines and in columns are made semi-insulating. These zones 14 provide the separation between the individual diodes of the matrix. They extend from the surface of the layer 12 as far as the level of the upper parts 7 of the localization zones.

The linewise connection of the diodes being obtained by the highly doped semiconductor regions 4, metallizations 19, 20 connecting the diodes columnwise are realized. The active part of the contact at the level of each diode is constituted laterally by the metallization 19' and transversely by the metallization 20 (cf. FIG. 2), these symbols designating metallization regions overhanging the localization zones 9. These active regions 19' and 20 extend internally parallel to the direction of the lines and the columns to above the edge 9' of the localization zones 9 as shown in FIG. 1e.

Figure 2:
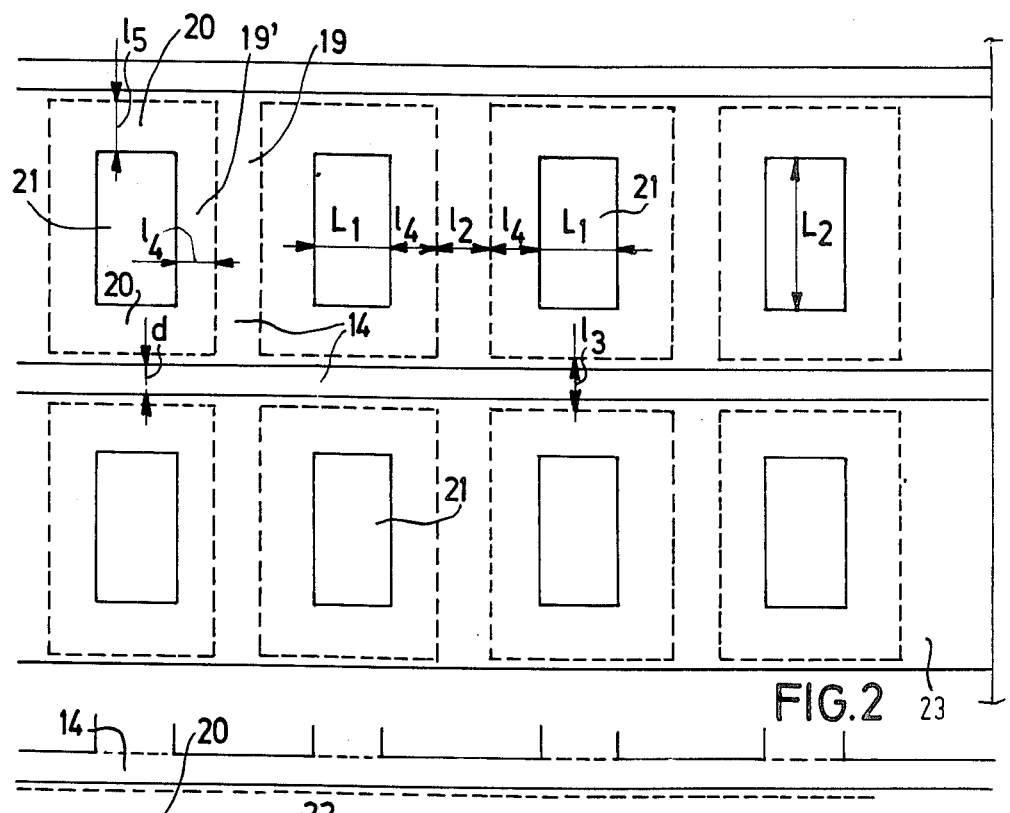
FIG. 2 is a plan viiew of FIG. 1e.

In FIG. 2, which shows a preferred embodiment, the contour of the semi-insulating zones 14 is indicated by dotted lines. At each pitch, the longitudinal bands have transverse bands 19 situated on the semi-insulating zones 14 arranged in lines and being laterally prolonged on either side by the active zones 19' so that the columnwise connection of the diodes is obtained.

The structure thus obtained is then defined in the functional plane in the following manner.

As stated above, the highly doped semiconductor regions 4 interconnect the active zones 10, 11 of the diodes linewise on the lower surface of the matrix, while the metallizations 19, 20 interconnect the injection zones thereof columnwise on the upper surface or emission surface of the matrix, the contact for each diode being formed in the active regions 19' and 20 enclosing an opening 21 straight above the openings 6 and of the same dimensions ($L_1$ parallel to the columns and $L_2$ parallel to the lines). The metallizations 19,20 are therefore or situated outside the active light-emitting zone of each diode, which is defined, by the localization zones 7, 9. In the direction of the columns, the semi-insulating zones 14 permit of electrically insulating from each other the metallizations connecting the diodes columnwise.

As far as the dimensional characteristics of the matrix are concerned, the thickness $e_0$ of the layer 2 depends (all conditions otherwise being the same) upon the admissible series resistance. The width $L_1$ of the zones 8 is preferably reduced to the greatest possible extent, on the one hand because they fulfill only a function of electrical insulation between the adjacent regions 4 (inversely connected diodes) and on the other hand because, the localization layer 7 not necessarily having a thickness of more than a few microns, during the epitaxy only an imperfect compensation of the step formed by the openings 3 is obtained, which becomes manifest by level inequalities at the surface of the layer 5 which should preferably not be excessively accentuated. It should be noted that these level inequalities do not influence the operation, because they occur at areas at which the layers deposited afterwards are then rendered semi-insulating.

The excess thickness $e_2$ of the layer 10 and the thickness $e_3$ of the layer 12 as well as the doping thereof are chosen in a conventional manner. The width $L_2$ of the semi-insulating zones 14 situated in the direction of the lines is chosen so that a satisfactory electrical insulation between the diodes is ensured, while their width $L_3$ in the direction of the columns is chosen so that a satisfactory insulation between the metallizations can be obtained. Furthermore, the width $L_4$ and the width $L_5$ of the active regions 19' and 20, respectively, of the metallizations have to be sufficient for obtaining a good contact; this criterion can be readily satisfied without a noticeable increase of the distance between the diodes, since the contact is formed along the whole circumference.

As far as the contacts are concerned, they are formed on the upper surface on layers 23 situated at the ends of the columns at the end of the metallizations 19, 20. As far as the conducting regions 4 are concerned, the contact is advntageously formed at the end of each line through openings provided in a known manner at one of the surfaces of the matrix.

By way of example and for a pitch of the diode lattice of 50×100 μm at the pitch of 190 μm parallel to the lines and of 150 μm according to the columns, with $L_1=50$ μm and $L_{20}=100$ μm, $1_1$ can be chosen to be equal to 30 μm, $l_2=l_3=30$ μm, $l_4=35$ μm and $l_5=30$ μm, the distance d separating the metallizations of the adjacent columns then being equal to $l_3=30$ μm.

Figure 3:
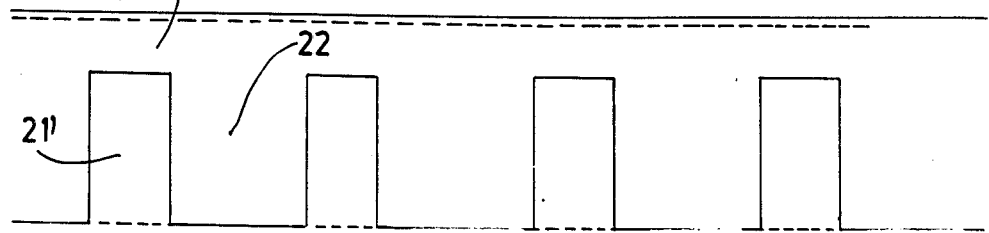
FIG. 3 shows a variation of FIG. 2.

According to the variation shown in FIG. 3, each metallization comprises a single longitudinal band 20 situated on the semi-insulating zones 14 arranged in columns. At each pitch, the band 20 is prolonged by a transverse band 22 so that it surrounds each individual diode on three sides of an opening 21 situated straight above the corresponding opening 6 and having the same dimensions as the latter. It should be noted that in this embodiment, semi-insulating zones 14 arranged in lines are not shown. This could also be effected in the case of the preceding Figures. In fact, the only function of the semi-insulating zones 14 arranged in lines is to provide an optimum electrical insulation between the adjacent diodes. In fact, this insulation is not absolutely necessary for two reasons. On the one hand, the localization layer 7 of a given diode directs the current lines between the region 4 forming a line contact and the metallization 19, 20 forming a column contact of the diode concerned at right angles to the plane of the substrate, while on the other hand the leakage path between the line contact 4 and an adjacent metallization is fairly long due to the fact that the pitch of the diodes of the matrix is considerably higher than the excess thickness $e_2$ of the layer 10 and the thickness $e_3$ of the layer 13, through which the normal conduction takes place. Consequently, the emission of the semi-insulating zones 14 arranged in lines can lead in the worst case to only a weak parasitic illumination from two adjacent diodes to a normally illuminated diode.

The invention is not limited to the embodiments described and represented. Thus, active layers and/or injection layers of a binary composition, for example of GaAs, may be formed.

What is claimed is:

1. A matrix of light-emitting diodes connected by conducting contacts and comprising an active layer of a III-V semiconductor material of a first conductivity type, a surface-adjacent injection layer of a III-V semiconductor material of the second, opposite conductivity type, semi-insulating zones arranged in columns and extending through said injection layer and said active layer to at least partially separate individual diodes, said semi-insulating zones being covered by at least a part of said conducting contacts, local zones of III-V semiconductor material of the second conductivity type, each semi-insulating zone extending from the surface of said injection layer to one of said local zones of III-V semiconductor material of the second conductivity type, said local zones each comprising an upper part and a lower part, said upper parts defining a two-dimensional lattice of cells filled by portions of said active layer, doped semiconducting contact regions of the first conductivity type interconnecting the diodes in rows at the level of said portions, said lower parts being spaced apart by said contact regions, and further comprising, on said injection layer, electrical contact metallizations arranged in interconnection columns in which, for each diode, contact metallization extends substantially opposite the upper part of the local zone, said interconnection columns being electrically insulated from each other by said semi-insulating zones.

2. A matrix as claimed in claim 1, characterized in that the active layer is of a ternary III-V semiconductor material.

3. A matrix as claimed in claim 1, characterized in that the injection layer is of a ternary III-V semiconductor material.

4. A matrix as claimed in claim 2 or 3, characterized in that said matrix comprises a substrate layer of a binary III-V semiconductor material.

5. A matrix as claimed in claim 4, characterized in that the binary semiconductor material is gallium arsenide and the ternary semiconductor material is gallium alluminum arsenide.

6. A matrix as claimed in claim 1, 2, 3, or 5, characterized in that the semi-insulating zones also are aligned so that they provide an electrical insulation between the adjacent diodes.

* * * * *